United States Patent
Jan et al.

(10) Patent No.: US 8,987,848 B2
(45) Date of Patent: Mar. 24, 2015

(54) CO/NI MULTILAYERS WITH IMPROVED OUT-OF-PLANE ANISOTROPY FOR MAGNETIC DEVICE APPLICATIONS

(71) Applicant: Headway Technologies, Inc., Milpitas, CA (US)

(72) Inventors: Guenole Jan, San Jose, CA (US); Ru-Ying Tong, Los Gatos, CA (US); Yu-Jen Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/244,940

(22) Filed: Apr. 4, 2014

(65) Prior Publication Data
US 2014/0217530 A1 Aug. 7, 2014

Related U.S. Application Data

(60) Division of application No. 13/955,039, filed on Jul. 31, 2013, now Pat. No. 8,698,261, and a division of application No. 13/561,201, filed on Jul. 30, 2012, now Pat. No. 8,508,006, and a continuation-in-part of application No. 13/068,398, filed on May 10, 2011, now Pat. No. 8,541,855.

(51) Int. Cl.
*H01L 29/82* (2006.01)
*H01L 43/00* (2006.01)
(Continued)

(52) U.S. Cl.
CPC ............. *H01L 43/12* (2013.01); *H01L 43/08* (2013.01); *H01L 43/10* (2013.01); *H01L 43/02* (2013.01);
(Continued)

(58) Field of Classification Search
USPC ................ 257/108, 421, 422, 424, 425, 426, 257/E27.006, E27.008, E29.167, E29.323, 257/E43.001
See application file for complete search history.

(56) References Cited

U.S. PATENT DOCUMENTS 6,881,503 B2 * 4/2005 Lu et al. .................. 428/828
7,190,613 B2 3/2007 Nagase et al.
(Continued)

OTHER PUBLICATIONS

"Magnetic anisotropies in Co/Ni(111) multilayers," by P.J.H. Bloemen et al., Journal of Applied Physics, vol. 72, No. 10, Nov. 15, 1992, pp. 4840-4844.

(Continued)

*Primary Examiner* — Ida M Soward
(74) *Attorney, Agent, or Firm* — Saile Ackerman LLC; Stephen B. Ackerman

(57) ABSTRACT

A MTJ for a spintronic device that is a domain wall motion device is disclosed and includes a thin seed layer that enhances perpendicular magnetic anisotropy (PMA) in an overlying laminated layer with a $(Co/X)_n$ or $(CoX)_n$ composition where n is from 2 to 30, X is one of V, Rh, Ir, Os, Ru, Au, Cr, Mo, Cu, Ti, Re, Mg, or Si, and CoX is a disordered alloy. The seed layer is preferably NiCr, NiFeCr, Hf, or a composite thereof with a thickness from 10 to 100 Angstroms. Furthermore, a magnetic layer such as CoFeB may be formed between the laminated layer and a tunnel barrier layer to serve as a transitional layer between a (111) laminate and (100) MgO tunnel barrier. The laminated layer may be used as a reference layer, dipole layer, or free layer in a MTJ. Annealing between 300° C. and 400° C. may be used to further enhance PMA in the laminated layer.

6 Claims, 5 Drawing Sheets

(51) Int. Cl.
*H01L 29/34* (2006.01)
*H01L 29/74* (2006.01)
*H01L 31/111* (2006.01)
*H01L 43/12* (2006.01)
*H01L 43/08* (2006.01)
*H01L 43/10* (2006.01)
*H01L 43/02* (2006.01)
*G11C 11/16* (2006.01)
*H01F 10/30* (2006.01)
*H01F 10/32* (2006.01)
*H01L 29/66* (2006.01)
*H01F 41/30* (2006.01)

(52) U.S. Cl.
CPC .............. *G11C 11/161* (2013.01); *H01F 10/30* (2013.01); *H01F 10/3286* (2013.01); *H01L 29/66007* (2013.01); *H01L 29/66984* (2013.01); *H01F 10/3254* (2013.01); *H01F 41/307* (2013.01)
USPC ........... 257/421; 257/108; 257/422; 257/424; 257/425; 257/426; 257/E27.006; 257/E27.008; 257/E29.167; 257/E29.323; 257/E43.001

(56) References Cited

U.S. PATENT DOCUMENTS

| | | | |
|---|---|---|---|
| 7,514,162 B2* | 4/2009 | Berger et al. | 428/828.1 |
| 7,843,669 B2 | 11/2010 | Fukuzawa et al. | |
| 8,064,244 B2 | 11/2011 | Zhang et al. | |
| 8,592,927 B2* | 11/2013 | Jan et al. | 257/421 |
| 8,593,862 B2* | 11/2013 | Ranjan et al. | 365/158 |
| 2004/0265639 A1 | 12/2004 | Hintz et al. | |
| 2008/0151615 A1 | 6/2008 | Rodmacq et al. | |
| 2010/0330395 A1 | 12/2010 | Zhang et al. | |
| 2011/0064969 A1 | 3/2011 | Chen et al. | |
| 2011/0096443 A1 | 4/2011 | Zhang et al. | |
| 2011/0273802 A1 | 11/2011 | Zhou et al. | |
| 2011/0279921 A1 | 11/2011 | Zhang et al. | |
| 2011/0293967 A1* | 12/2011 | Zhang et al. | 428/827 |
| 2012/0075927 A1* | 3/2012 | Chen et al. | 365/173 |
| 2012/0139649 A1* | 6/2012 | Zhou et al. | 331/94.1 |
| 2013/0005052 A1* | 1/2013 | Hu et al. | 438/3 |
| 2013/0078482 A1* | 3/2013 | Shukh | 428/811.1 |
| 2013/0258764 A1* | 10/2013 | Ranjan et al. | 365/158 |
| 2014/0008744 A1* | 1/2014 | Huai et al. | 257/421 |
| 2014/0015076 A1* | 1/2014 | Gan et al. | 257/421 |

OTHER PUBLICATIONS

"Spin transfer switching in TbCoFe/CoFeB/MgO/CoFeB/TbCoFe magnetic tunnel junctions with perpendicular magnetic anisotropy," by Nakayama et al., Journal of Applice Physics, 103, 07A710, Apr. 2008, pp. 1-3.

"Spin-torque driven ferromagnetic resonance of Co/Ni synthetic layers in spin valves," by W. Chen et al., Applied Physics Letters 92, 012507, Jan. 4, 2008, pp. 1-3.

"Current-driven excitation of magnetic multilayers," by J.C. Slonczewski, Journal of Magnetism and Magnetic Materials 159 (Jun. 1996) L1-L7, Elsevier.

European Search Report, 12781625.4-1564/2707876, PCT/US2012035104, Mail date: Sep. 15, 2014.

* cited by examiner

CO/NI MULTILAYERS WITH IMPROVED OUT-OF-PLANE ANISOTROPY FOR MAGNETIC DEVICE APPLICATIONS

This is a Divisional application of U.S. patent application Ser. No. 13/955,039 filed on Jul. 31, 2013 which is a divisional of Ser. No. 13/561,201 filed on Jul. 30, 2012 that is a continuation in part of U.S. patent application Ser. No. 13/068,398, filed on May 10, 2011 and issued as U.S. Pat. No. 8,541,855, which are herein incorporated by reference in their entirety, and assigned to a common assignee.

FIELD OF THE INVENTION

The invention relates to a magnetic device that employs a thin film made of a Ni/Co laminate or the like with a magnetization direction which is perpendicular to the plane of the film (perpendicular magnetic anisotropy or PMA) wherein PMA is enhanced by an improved seed layer that induces a strong (111) crystal structure in the Ni/Co multilayer stack.

BACKGROUND OF THE INVENTION

Magnetoresistive Random Access Memory (MRAM), based on the integration of silicon CMOS with magnetic tunnel junction (MTJ) technology, is a major emerging technology that is highly competitive with existing semiconductor memories such as SRAM, DRAM, and Flash. Similarly, spin-transfer (spin torque or STT) magnetization switching described by C. Slonczewski in "Current driven excitation of magnetic multilayers", J. Magn. Magn. Mater. V 159, L1-L7 (1996), has stimulated considerable interest due to its potential application for spintronic devices such as spin-torque MRAM on a gigabit scale.

Both MRAM and STT-MRAM may have a MTJ element based on a tunneling magneto-resistance (TMR) effect wherein a stack of layers has a configuration in which two ferromagnetic layers are separated by a thin non-magnetic dielectric layer. The MTJ element is typically formed between a bottom electrode such as a first conductive line and a top electrode which is a second conductive line at locations where the top electrode crosses over the bottom electrode. A MTJ stack of layers may have a bottom spin valve configuration in which a seed layer, an anti-ferromagnetic (AFM) pinning layer, a ferromagnetic "pinned" layer, a thin tunnel barrier layer, a ferromagnetic "free" layer, and a capping layer are sequentially formed on a bottom electrode. The pinned or reference layer has a magnetic moment that is fixed in the "y" direction, for example, by exchange coupling with the adjacent anti-ferromagnetic (AFM) layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("0" memory state) and a higher resistance is noted when they are in an anti-parallel state or "1" memory state.

As the size of MRAM cells decreases, the use of external magnetic fields generated by current carrying lines to switch the magnetic moment direction becomes problematic. One of the keys to manufacturability of ultra-high density MRAMs is to provide a robust magnetic switching margin by eliminating the half-select disturb issue. For this reason, the spin torque MRAM was developed. Compared with conventional MRAM, spin- torque MRAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a spin-torque MRAM and a conventional MRAM is only in the write operation mechanism. The read mechanism is the same.

For MRAM and spin-torque MRAM applications, it is often important to take advantage of PMA films with a large and tunable coercivity field (Hc) and anisotropy field (Hk). For example, PMA films may be used as a pinned layer, free layer, or dipole (offset compensation) layer in a MTJ element or in PMA media used in magnetic sensors, magnetic data storage, and in other spintronic devices. Furthermore, a critical requirement is that Hc, Hk, and other properties such as the magnetoresistive (MR) ratio do not deteriorate during processing at elevated temperatures up to the 300° C. to 400° C. range. In some applications, it is also necessary to limit the overall thickness of the PMA layer and underlayers, and use only materials that are compatible with device design and processing requirements.

Materials with PMA are of particular importance for magnetic and magnetic-optic recording applications. Spintronic devices with perpendicular magnetic anisotropy have an advantage over MRAM devices based on in-plane anisotropy in that they can satisfy the thermal stability requirement and have a low switching current density but also have no limit of cell aspect ratio. As a result, spin valve structures based on PMA are capable of scaling for higher packing density which is one of the key challenges for future MRAM applications and other spintronic devices.

When the size of a memory cell is reduced, much larger magnetic anisotropy is required because the thermal stability factor is proportional to the volume of the memory cell. Generally, PMA materials have magnetic anisotropy larger than that of conventional in-plane soft magnetic materials such as NiFe or CoFeB. Thus, magnetic devices with PMA are advantageous for achieving a low switching current and high thermal stability.

Several PMA material systems have been proposed and utilized in the prior art such as multilayers of Pt/Fe, Pd/Co, and Ni/Co, and ordered (e.g., L10 structures) as well as unordered alloys but there is still a need for improvement in Hc, Hk, temperature stability, and material compatibility. There is a report by M. Nakayama et al. in "Spin transfer switching in TbCoFe/CoFeB/MgO/CoFeB/TbCoFe magnetic tunnel junctions with perpendicular magnetic anisotropy", J. Appl. Phys. 103, 07A710 (2008) related to spin transfer switching in a MTJ employing a TbCoFe PMA structure. However, in a MTJ with a TbCoFe or FePt PMA layer, strenuous annealing conditions are usually required to achieve an acceptably high PMA value. Unfortunately, high temperatures are not so practical for device integration.

Although $(Co/Pt)_x$ laminates are capable of generating high PMA, Co/Pt and similar multilayers including Co/Pd and Co/Ir and alloys thereof such as CoCrPt are not always desirable as a PMA layer in a MTJ element because Pt, Pd, Ir, and Cr are severe spin depolarizing materials and will seriously quench the amplitude of spintronic devices.

Among the PMA material systems studied, a Ni/Co multilayer is one of the more promising candidates because of its large potential He and Hk, good stability at high anneal temperatures, and potential compatibility with other materials used in magnetic devices. However, Ni/Co multilayers typically require a thick seed layer to induce high PMA. A 500 Angstrom Ti or 500 Angstrom Cu seed layer with heating to 150° C. is used by P. Bloemen et al. in "Magnetic anisotropies in Co/Ni (111) multilayers", J. Appl. Phys. 72, 4840 (1992). W. Chen et al. in "Spin-torque driven ferromagnetic resonance of Co/Ni synthetic layers in spin valves", Appl. Phys. Lett. 92, 012507 (2008) describe a 1000 Angstrom Cu/200 Angstrom Pt/100 Angstrom Cu composite seed layer. The aforementioned seed layers are not practical with Ni/Co multilayer PMA configurations in spintronic devices. Typically, there is a space restriction in a direction perpendicular to the planes of the spin valve layers in advanced devices in order to optimize performance. Seed layers thicker than about 100 Angstroms will require thinning a different layer in the spin valve structure to maintain a certain minimum thickness for the MTJ element which can easily lead to performance degradation.

A $[(Co/Ni)_{20}]$ laminated structure with a thin Ta/Ru/Cu seed layer is disclosed as a hard bias layer in U.S. Patent Application Publication 2010/0330395 and as a reference layer in U.S. Patent Application Publication 2009/0257151. However, even higher Hc is desirable to be competitive with Hc values obtained with Pt/Co and Pd/Co laminates.

In U.S. Pat. No. 7,843,669, a fcc (111) crystal orientation is described as desirable for a pinned layer or free layer but a Ni/Co laminate with (111) orientation is not disclosed.

U.S. Pat. No. 7,190,613 describes a fixed layer having a high coercive force and made of ordered alloys such as FePt, CoPt, and FePd, or disordered alloys including Co/Cr, Co/Pt, Co/Cr/Pt and the like. For ordered alloys with a fct(001) orientation, an underlayer such as MgO, Pt, Pd, Au, Ag, Al or Cr with a similar crystal structure is preferred.

An improved seed layer is still needed that is thin enough to be compatible with spintronic devices, can induce high PMA in overlying Co/Ni multilayer structures, and is compatible with the design and processing requirements of magnetic devices.

SUMMARY OF THE INVENTION

One objective of the present invention is to provide a seed layer/PMA layer configuration for a magnetic device that has higher Hk and Hc than previously realized and with thermal stability up to 400° C. process temperatures.

A second objective of the present invention is to provide a material set for a high PMA structure according to the first objective that is compatible with other layers in the magnetic device and has a seed layer thickness of about 100 Angstroms or less.

According to one embodiment, these objectives are achieved with a magnetic element that is a MTJ having a bottom spin valve configuration in which a seed layer, PMA reference layer, tunnel barrier, free layer, and capping layer are sequentially formed on a substrate. The seed layer (underlayer) is preferably NiCr, NiFeCr, Hf, or a composite with a Hf/NiCr, Hf/NiFeCr, NiFeCr/Hf, or NiCr/Hf configuration that induces a strong (111) texture in the overlying Co/Ni multilayer stack within the reference layer. In an alternative embodiment, Ni in the Co/Ni multilayer is replaced by X to give a Co/X multilayer stack within the reference layer where X is one of V, Rh, Ir, Os, Ru, Au, Cr, Mo, Cu, Ti, Re, Si, and Mg. Preferably, the reference layer has a $[(Co/Ni)_n/CoFeB]$ or $[Co/X)_n/CoFeB]$ configuration where n is from 2 to 30 and the CoFeB (or CoFe) layer serves as a transitional layer between the (111) crystalline structure of the Co/Ni or Co/X multilayer stack and the (100) texture of a MgO tunnel barrier. The transitional layer preferably has PMA and a magnetization aligned in the same direction as the PMA layer. The free layer may be comprised of CoFeB, CoFe, or a combination thereof. Thus, a high MR ratio is achieved together with high PMA in the reference layer to enable greater thermal stability in the magnetic element.

In a second embodiment, the MTJ has a top spin valve structure wherein a seed layer, PMA free layer, tunnel barrier, reference layer, and capping layer are sequentially formed on a substrate. The PMA free layer may be a composite with a Co/Ni or Co/X laminate formed on the seed layer and an upper magnetic layer contacting the tunnel barrier. Again, the magnetic layer may be CoFeB and serve as a transitional layer between a (100) MgO tunnel barrier and a Co/Ni multilayer with a (111) texture. Both of the first and second embodiments may further comprise a Ta insertion layer between the Co/Ni or Co/X multilayer and the transitional layer to prevent premature crystallization of the transitional layer before the tunnel barrier is fabricated.

In a third embodiment, a dipole layer with an underlayer/PMA layer configuration as defined in the first embodiment is used to provide an offset field to an adjacent free layer. The MTJ has a stack represented by seed layer/reference layer/tunnel barrier/free layer/spacer/dipole layer/capping layer. The spacer may be a non-magnetic Ta layer to getter oxygen from the free layer.

Once all the layers in the MTJ stack are laid down, a high temperature annealing of about 350° C. may be employed to increase the PMA within the Co/Ni laminated portion of the reference layer, free layer, or dipole layer.

Alternatively, the $(Co/Ni)_n$ multilayer in the previous embodiments may be replaced by a CoFe/Ni, Co/NiFe, Co/NiCo, CoFe/NiFe, or a CoFe/NiCo laminated structure, by pure Co, or may be one of Co/Pt, Co/Pd, Fe/Pt, Fe/Pd, or Fe/V.

In yet another embodiment, the (Co/X) stack described previously may be replaced by a disordered alloy that is one of CoV, CoRh, CoIr, CoOs, CoRu, CoAu, CoCr, CoMo, CoCu, CoTi, CoRe, CoMg, or CoSi to give a $(CoX)_n$ laminated PMA layer.

DETAILED DESCRIPTION OF THE INVENTION

Figure 1:
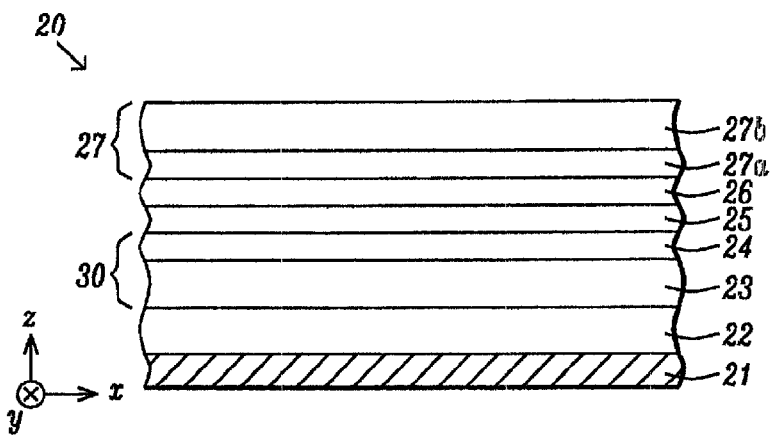
FIG. 1 is a cross-sectional view showing a magnetic element including a composite reference layer with a laminated PMA layer/magnetic transitional layer formed according to a first embodiment of the present invention.

The present invention is a composite structure with a seed layer/PMA layer configuration in a magnetic element wherein the seed layer induces a strong (111) crystalline structure in an overlying $(Ni/Co)_n$, $(Co/X)_n$ or $(CoX)_n$ multilayer where X is one of V, Rh, Ir, Os, Ru, Au, Cr, Mo, Cu, Ti, Re, Mg, or Si thereby generating high PMA in the laminated stack. Note that "seed layer" may be used interchangeably with the term "underlayer" in the exemplary embodiments, and $(Ni/Co)_n$ and $(Co/Ni)_n$, for example, are used interchangeably when referring to a laminated stack. Although only bottom and top spin valve structures are depicted in the drawings, the present invention also encompasses dual spin valves having an enhanced PMA layer that is incorporated in one or more of a reference layer, free layer, dipole layer, or pinned layer in MRAM, spin-torque-MRAM, domain wall motion devices, and in other spintronic devices. Furthermore, the PMA structure may be used as a medium in magnetic sensors or in magnetic data storage applications.

A key feature of the present invention is a $(Co/Ni)_n$ or $(Co/X)_n$ multilayer structure having PMA where the perpendicular magnetic anisotropy of the aforementioned laminate arises from spin-orbit interactions of the 3d and 4s electrons of Co and Ni (or Co and X) atoms. Such interaction causes the existence of an orbital moment which is anisotropic with respect to the crystal axes which are in (111) alignment, and also leads to an alignment of the spin moment with the orbital moment. PMA character is enhanced by the presence of an appropriate seed layer (underlayer) also having a (111) texture. Ideally, the seed layer has a composition which is compatible with other materials in a magnetic element that contains the $(Co/Ni)_n$ or $(Co/X)_n$ laminate, is compatible with processing temperatures up to about 400° C., and is thin enough so as not to adversely affect the performance of the magnetic element.

Referring to FIG. 1, a seed layer/PMA multilayer configuration is shown as part of a MTJ 20 with a bottom spin valve structure according to a first embodiment of the present invention. Each of the layers in the MTJ are formed in an (x, y) plane and each have a thickness in a z-axis direction. A substrate 21 is provided that may be a bottom electrode layer, for example, made of Ta or other conductive layers. Substrate 21 may be formed on a substructure (not shown) that includes dielectric and conductive layers as well as transistors and other devices. A key feature is the seed layer 22 formed on substrate 21. The seed layer 22 has a thickness from 10 to 300 Angstroms, and preferably 10 to 100 Angstroms. According to one embodiment, the seed layer is NiCr, NiFeCr, or Hf. For a NiCr or NiFeCr seed layer, Cr content is between 35 and 45 atomic % Cr, and preferably is 40 atomic % Cr. Alternatively, seed layer 22 may be a composite with a Hf/NiCr, Hf/NiFeCr, NiFeCr/Hf, or NiCr/Hf composition wherein the NiCr or NiFeCr layer has a greater thickness than the Hf layer. As a result of the preferred seed layer composition, a (111) texture is induced and fully established in a $(Co/Ni)_n$ multilayer or the like grown on a top surface of the seed layer. Top surface in this context is a surface facing away from substrate 21.

Above the seed layer 22 is a composite reference layer 30 that according to one embodiment has a $(Co/Ni)_n/CoFeB$, a $(Co/X)_n/CoFeB$, or $(CoX)_n/CoFeB$ configuration wherein a lower PMA layer 23 has a $(Co/Ni)_n$, $(Co/X)_n$, or $(CoX)_n$ composition in which n is from 2 to 30, and preferably between 4 and 10, and CoX is a disordered alloy. PMA layer 23 contacts the seed layer while a magnetic layer 24 made of CoFeB, CoFe, or a combination thereof is formed as an interface between the PMA layer and the tunnel barrier 25. Each of the plurality of Co layers in the PMA layer has a thickness from 1.5 to 4 Angstroms, and each of the plurality of Ni, X, or CoX layers has a thickness from 4 to 10 Angstroms. In yet another embodiment, PMA layer 23 may be pure Co.

In another embodiment, the lower PMA layer 23 may be comprised of two metals, a metal and an alloy, or two alloys having an $(A1/A2)_n$ configuration where A1 is a first metal or alloy selected from one or more of Co, Ni, and Fe that may be doped with B up to 50 atomic %, A2 is a second metal or alloy selected from one or more of Co, Fe, Ni, Pt, and Pd, n is the number of laminates in the $(A1/A2)_n$ stack, and A1 is unequal to A2. It should be understood that the laminated $(A1/A2)_n$ stack has intrinsic PMA and the seed layer 22 is employed to enhance the PMA property. Thus, the PMA layer 23 may be comprised of $(CoFe/Ni)_n$, $Co/NiFe)_n$, $(Co/NiCo)_n$, $(CoFe/NiFe)_n$, or $(CoFe/NiCo)_n$ laminates, for example. Alternatively, the PMA layer may have a $(Co/Pt)_n$, $Co/Pd)_n$, $(Fe/Pt)_n$, $(Fe/Pd)_n$, or $(FeN)_n$ composition, or a combination of the aforementioned laminates. In another embodiment, A2 is a second metal or alloy selected from one or more of X, FeX, and CoX. In this case, the PMA layer 23 may be comprised of $(CoFe/X)_n$, $Co/FeX)_n$, $(Co/CoX)_n$, $(CoFe/FeX)_n$, or $(CoFe/CoX)_n$ laminates.

In yet another embodiment, the lower PMA layer 23 may be comprised of two individual magnetic layers separated by a non-magnetic spacer (C) providing anti-ferromagnetic (RKKY) coupling between the two magnetic layers as in an A1/C/A2 configuration. In this embodiment, the non-magnetic spacer is preferably Ru with a thickness of 3 to 20 angstroms.

The present invention also encompasses an embodiment wherein the lower PMA layer 23 may be an alloy with a L10 structure of the form MT wherein M is Rh, Pd, Pt, Ir, or an alloy thereof, and T is Fe, Co, Ni or alloy thereof. Furthermore, the MT alloy may be doped with B up to 40 atomic %.

Preferably, the magnetic layer 24 has a thickness from about 6 to 14 Angstroms which is sufficiently thin to enable interfacial perpendicular anisotropy to dominate the in-plane shape anisotropy field and thereby generate PMA character therein. According to one embodiment, PMA within magnetic layer 24 is achieved as a result of the interface between a thin CoFeB (or CoFe) layer and a metal oxide layer in tunnel barrier 25 that leads to a significant amount of interfacial perpendicular anisotropy, and the magnetic moments of layers 23, 24 are aligned in the same direction along the z-axis. The magnetic layer serves as a transitional layer between the (111) texture in PMA layer 23 and a (100) texture in tunnel barrier 25 and may also enhance the magnetoresistive (MR) ratio. As the magnetic layer thickness becomes closer to 6 Angstroms, PMA character is maximized, and as layer 24 thickness approaches 14 Angstroms, MR ratio is increased. Therefore, the thickness of the magnetic layer may be adjusted between 6 and 14 Angstroms to tune both PMA magnitude and MR ratio.

There is a tunnel barrier layer 25 preferably made of MgO formed on the composite reference layer 30. However, other tunnel barrier materials such as AlOx, TiOx, and ZnOx may be employed. A MgO tunnel barrier layer may be fabricated by depositing a first Mg layer on the magnetic layer 24, then performing a natural oxidation (NOX) process, and finally depositing a second Mg layer on the oxidized first Mg layer. During a subsequent annealing process, the second Mg layer is oxidized to afford a substantially uniform MgO layer. If a low RA (resistance x area) value is desired, the thickness and/or oxidation state of the tunnel barrier 25 may be reduced as appreciated by those skilled in the art.

A free layer 26 is formed on the tunnel barrier layer 25 and may be a composite and comprised of the same composition as in magnetic layer 24. Preferably, CoFeB, CoFe, or other materials which produce a combination of high MR ratio, good switching property, and low magnetostriction are selected as the free layer.

The uppermost layer in the spin valve stack is a capping layer 27. In one aspect, the capping layer is a composite with a lower layer 27a made of Ta and an upper layer 27b that is Ru which is used to provide oxidation resistance and excellent electrical contact to an overlying top electrode (not shown). A substantial reduction in critical current density (Jc) occurs in STT-MRAM applications when a thin Ru layer is employed as a capping layer due to the strong spin scattering effect of Ru. The Ta layer may be included to offer etch resistance in subsequent processing steps. Optionally, other capping layer configurations may be employed. For example, the capping layer 27 may be a single layer of Ta or Ru, a composite with a Ru/Ta/Ru configuration, or a composite with a lower oxide or nitride layer and an upper Ru layer such as MgO/Ru or AlOx/Ru. An oxide as the lower layer in the capping layer may be advantageously used to promote PMA in a thin free layer 26.

Figure 2:
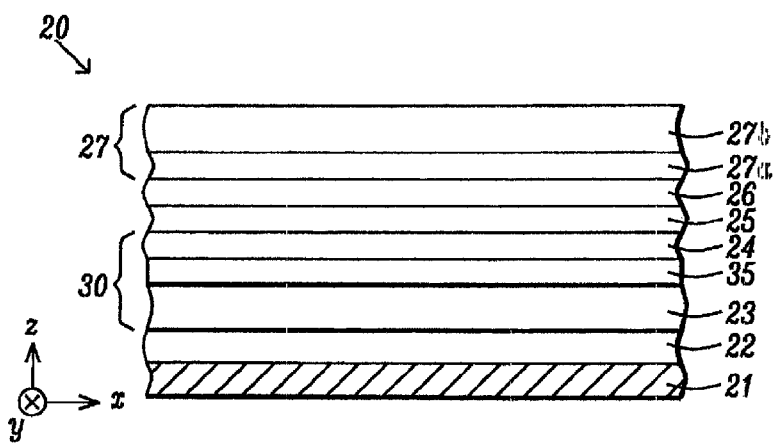
FIG. 2 is the magnetic element in FIG. 1 further comprising a Ta insertion layer between the laminated PMA layer and the magnetic transitional layer according to another embodiment of the present invention.

Referring to FIG. 2, the composite reference layer 30 of the first embodiment is modified to include a Ta insertion layer 35 about 0.5 to 3 Angstroms thick, and preferably 1.5 Angstroms thick, sandwiched between the PMA layer and an amorphous CoFeB magnetic layer 24 to prevent crystallization of the CoFeB layer before a MgO tunnel barrier 25 is formed thereon. As a result, crystallization of an amorphous CoFeB layer during a subsequent annealing step is driven by the (100) MgO tunnel barrier and a major portion (not shown) of the magnetic layer crystallizes in a (100) state to maximize the MR ratio in the MTJ. It should be understood that a thin region (not shown) of a CoFeB magnetic layer 24 which adjoins the PMA layer 23 will have a (111) crystal structure or remains amorphous but the thickness of this thin region may be minimized by including the Ta insertion layer 35.

Figure 3:
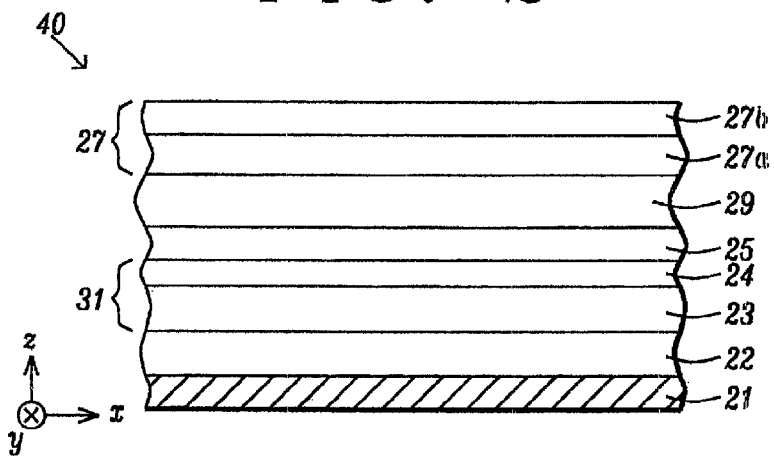
FIG. 3 is cross-sectional view of a magnetic element including a composite free layer formed according to a second embodiment of the present invention.

Referring to FIG. 3, a second embodiment is depicted that shows a MTJ 40 wherein the seed layer/PMA layer configuration of the present invention is incorporated in a composite free layer. In other words, the seed layer/PMA layer configuration as defined herein is not limited to a reference (pinned) layer but may be used as any functional or passive layer in a magnetic stack. Preferably, the MTJ in this embodiment has a top spin valve structure in which a seed layer, composite free layer, tunnel barrier, reference layer, and a capping layer are sequentially formed on substrate 21. The seed layer 22 and PMA layer 23 are retained from the first embodiment but in this case the laminated PMA layer is included in a composite free layer. Reference layer 29 formed on the tunnel barrier is comprised of CoFeB, CoFe, or combinations thereof and may have a well known synthetic anti-parallel (SyAP) configuration (not shown) wherein two ferromagnetic layers such as CoFeB are separated by a coupling layer which is Ru, for example. Tunnel barrier 25 and capping layer 27 are retained from the first embodiment.

Preferably, the tunnel barrier is MgO to maximize the MR ratio in the MTJ 40. Furthermore, the composite free layer 31 may have a seed layer 22/PMA layer 23/magnetic layer 24 configuration where the magnetic layer serves as a transitional layer between the (100) texture in the tunnel barrier layer and the (111) crystal structure in PMA layer 23 to promote a high MR ratio. Preferably, the magnetic layer 24 is made of CoFeB with a thickness of about 6 to 14 Angstroms so that interfacial perpendicular anisotropy dominates shape anisotropy within the layer to result in PMA with a magnetization direction that is aligned in the same z-axis direction as in PMA layer 23. The composite free layer 31 may further include a Ta insertion layer (not shown) formed between PMA layer 23 and magnetic layer 24. Seed layer (underlayer) 22 is preferably one of NiCr, NiFeCr, Hf, Hf/NiCr, Hf/NiFeCr, NiFeCr/Hf, or NiCr/Hf with a 5 to 200 Angstrom thickness to enhance the PMA character in PMA layer 23 thereby increasing thermal stability without compromising other free layer properties.

Figure 4:
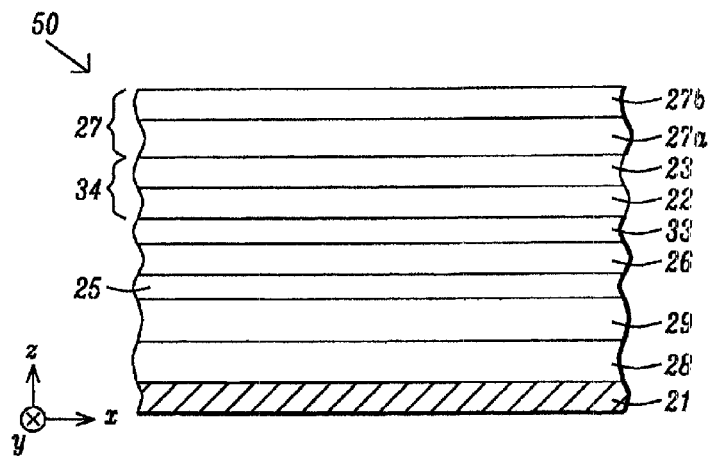
FIG. 4 is a cross-sectional view of a magnetic element including a composite dipole layer formed according to a third embodiment of the present invention.

Referring to FIG. 4, a third embodiment of the present invention is illustrated and depicts a MTJ 50 having a bottom spin valve structure wherein the seed layer/PMA layer of the present invention is employed as a dipole layer to reduce the offset of the minor switching loop of the free layer caused by a dipole field from the reference layer. According to one embodiment, a seed layer, reference layer, tunnel barrier, free layer, spacer, dipole layer, and a capping layer are sequentially formed on substrate 21. The seed layer 28 may be NiCr or NiFeCr. Reference layer 29 and tunnel barrier layer 25 are retained from the second embodiment. Preferably, the reference layer is thin with a thickness from 5 to 15 Angstroms.

Free layer 26 and capping layer 27 were previously described with regard to the first embodiment. In one aspect, a CoFeB/MgO/CoFeB reference layer/tunnel barrier/free layer may be employed to provide a high MR ratio.

A key feature is the stack of layers formed between the free layer and capping layer. In particular, a non-magnetic spacer 33 made of Ta, for example, contacts a top surface of free layer 26 and getters oxygen from the free layer. Above the spacer is a composite dipole layer 34 including an underlayer 22 that contacts a top surface of the spacer and a PMA layer 23 that interfaces with capping layer 27. Layers 22, 23 retain the same features as described with respect to the first two embodiments except the underlayer is preferably 5 to 100 Angstroms thick in this embodiment. In one aspect, free layer 26 may be sufficiently thin (6 to 15 Angstroms) to have significant interfacial perpendicular anisotropy that dominates an in-plane shape anisotropy field such that a magnetization perpendicular to the plane of the free layer is established. Interfacial perpendicular anisotropy is a result of the interface between a bottom surface of free layer 26 and a top surface of tunnel barrier 25 which is preferably MgO. When the free layer has PMA, the magnetization directions of the free layer and PMA layer 23 are preferably aligned in the same direction.

All of the layers in the MTJ elements described herein may be formed in a sputter deposition system such as an Anelva C-7100 thin film sputtering system or the like which typically includes three physical vapor deposition (PVD) chambers each having 5 targets, an oxidation chamber, and a sputter etching chamber. At least one of the PVD chambers is capable of co-sputtering. Typically, the sputter deposition process involves an argon sputter gas with ultra-high vacuum and the targets are made of metal or alloys to be deposited on a substrate. All of the MTJ layers may be formed after a single pump down of the sputter system to enhance throughput.

The present invention also encompasses an annealing step after all layers in the spin valve structure have been deposited. The MTJ elements 20, 40, 50 may be annealed by applying a temperature between 300° C. and 400° C. for a period of 30 minutes to 5 hours using a conventional oven, or for only a few seconds when a rapid thermal anneal oven is employed. No applied magnetic field is necessary during the annealing step because PMA is established in layer 23 due to the seed layer 22 and because of the Co—Ni (or A1-A2) spin orbital interactions in the laminated PMA layer 23.

Once all the layers in MTJ elements 20, 40, or 50 are formed, the spin valve stack is patterned into an oval, circular, or other shapes from a top-down perspective along the z-axis by a well known photoresist patterning and reactive ion etch transfer sequence. Thereafter, an insulation layer (not shown) may be deposited on the substrate 21 followed by a planarization step to make the insulation layer coplanar with the capping layer 27. Next, a top electrode (not shown) may be formed on the capping layer.

Figure 5:
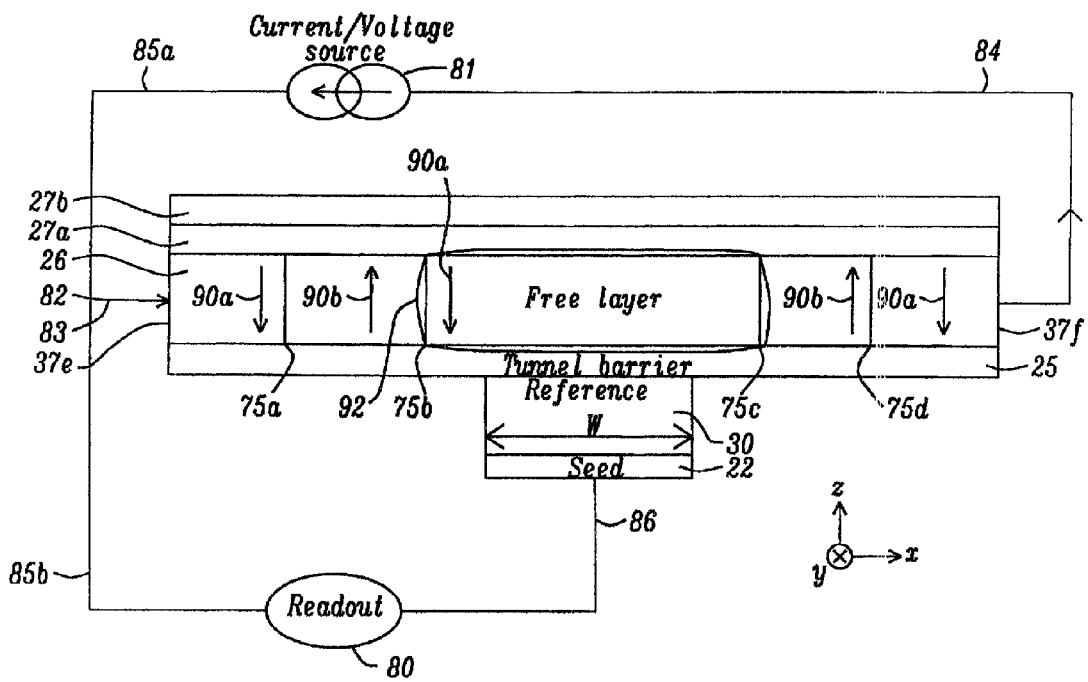
FIG. 5 is a cross-sectional view depicting an embodiment wherein a reference layer according to the first embodiment is formed in a domain wall motion device.

Referring to FIG. 5, an embodiment is depicted wherein the MTJ of the first embodiment is fabricated in a domain wall motion device. In one aspect, composite reference layer 30 is formed in a MTJ stack having a seed layer/reference layer/tunnel barrier/free layer/capping layer configuration. A key feature is that seed layer 22 and reference layer 30 have a width along an in-plane x-axis direction that is substantially less than the width of the overlying stack of layers. In fact, the stack of layers including tunnel barrier 25, free layer 26, and capping layer 27 may be patterned to provide a wire which from a top-down view (not shown) is part of an array of wires that are employed for storage of digital information. Another important feature is that free layer 26 has a plurality of domain walls (75a-75d) each extending vertically from a top surface that interfaces with layer 27a to a bottom surface which interfaces with tunnel barrier layer 25. There is a magnetic domain bounded by each pair of domain walls within the composite free layer. The number of domain walls is variable but is selected as four in the exemplary embodiment for illustrative purposes. In particular, the magnetic domain 92 aligned in a z-axis direction above reference layer 30 has a switchable magnetization that changes from a (+) z-direction to a (−) z-direction or vice versa when a switching current is applied during a write process. Note that free layer has two ends 37e, 37f connected to a current/voltage source 81 in a first electrical loop including wiring 85a to a junction 82 to wire 83 and to end 37e, and a wire 84 attached to end 37f to enable a write process. Furthermore, there is a second electrical loop which allows a readout of digital information in the switchable magnetic domain 92 during a read process. Thus, current can be sent from source 81 through wires 85a, 85b and to readout 80 and then to wire 86 and through reference layer 30, tunnel barrier 25, and free layer 26 before exiting end 37f and returning to the source to complete a circuit. In so doing, the readout device 80 is able to recognize whether the switchable magnetic domain 92 has a magnetization in a (+) z-axis direction 90b or in a (−) z-axis direction 90a.

EXAMPLE 1

Figure 6A:
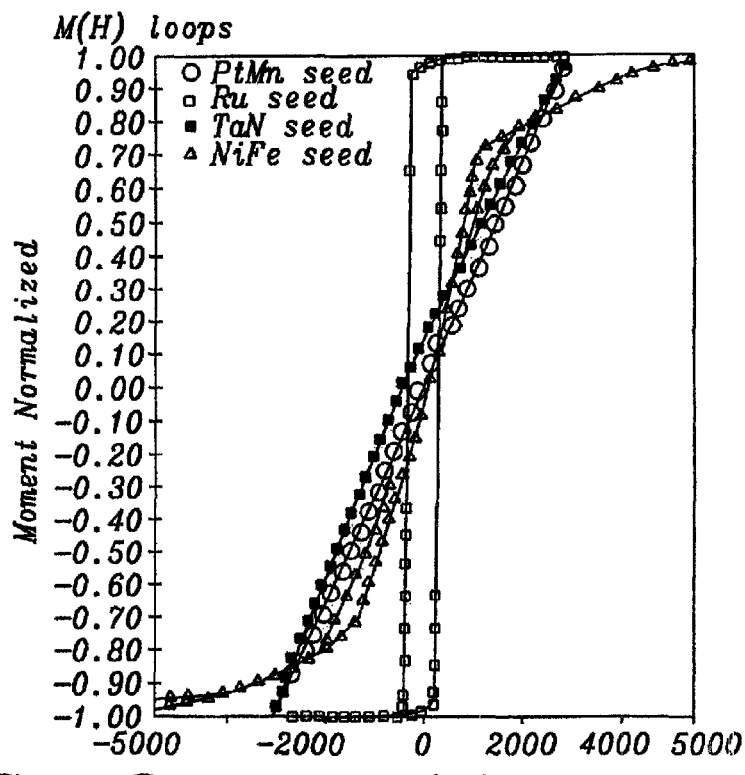
FIG. 6a is a plot illustrating magnetic properties measured perpendicular to the film plane for Co/Ni multilayers grown on less than optimal seed layers.
Figure 6B:
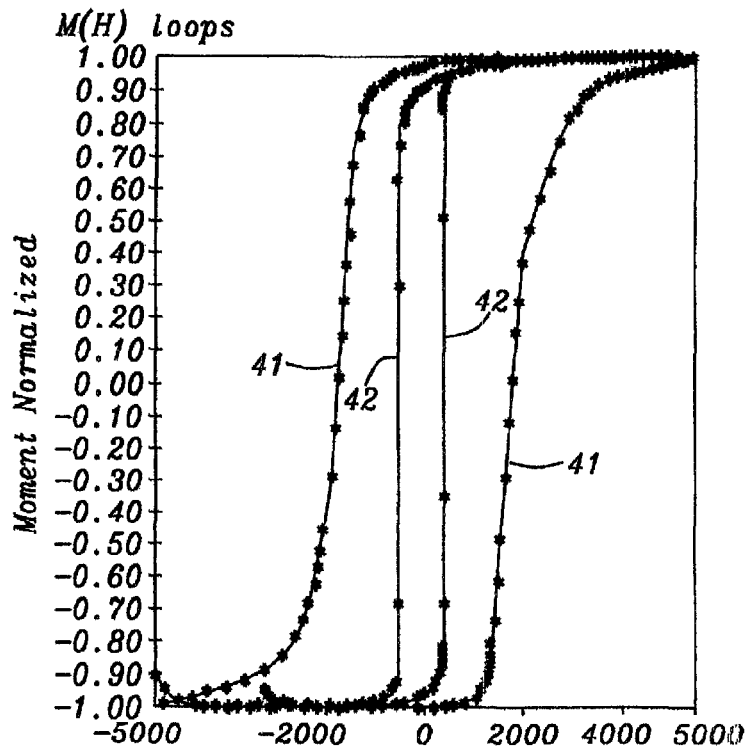
FIG. 6b is a plot illustrating magnetic properties measured perpendicular to the film plane for Co/Ni multilayers grown on Hf or NiCr seed layers according to an embodiment of the present invention.

An experiment was performed to demonstrate the advantage of a seed layer in improving PMA in an overlying (Co/Ni)$_n$ multilayer stack according to the present invention. A partial and unpatterned spin valve stack comprised of a seed layer, a (Co/Ni)$_{10}$ laminated layer where each Co layer is 2.5 Angstroms thick and each Ni layer is 6 Angstroms thick, and a Ru cap layer was fabricated in order to obtain PMA values from M-H curves using a vibrating sample magnetometer (VSM). All samples were annealed at 350° C. for 1 hour. In FIG. 6a, less than ideal seed layers such as TaN, PtMn, NiFe, and Ru were employed. In FIG. 6b, 100 Angstrom thick NiCr and Hf seed layers were formed according to the present invention to provide improved performance including squarer M-H loops and higher coercivity (higher PMA) as depicted in curves 41, 42, respectively, compared with the films grown on the inadequate seed layers in FIG. 6a. Note that a greater distance between the vertical sections of each pair of curves in FIG. 6b means a higher PMA is achieved. Thus, a NiCr seed layer leads to higher PMA than a Hf seed layer of similar thickness.

Figure 7A:
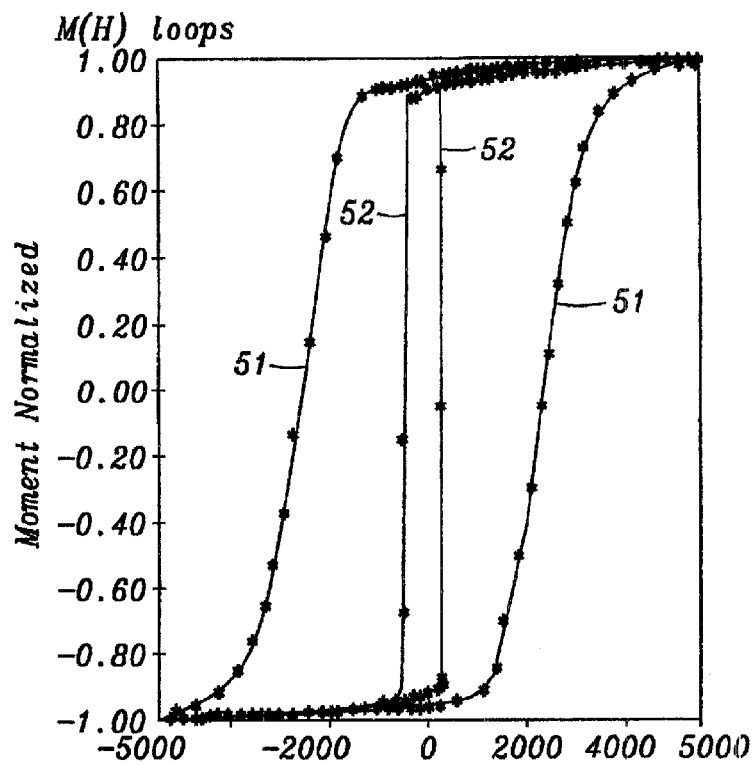
FIGS. 7a, 7b are plots showing magnetic properties measured perpendicular to the film plane and in-plane, respectively, for Co/Ni multilayers grown on Hf/NiCr or NiCr/Hf seed layers according to an embodiment of the present invention.
Figure 7B:
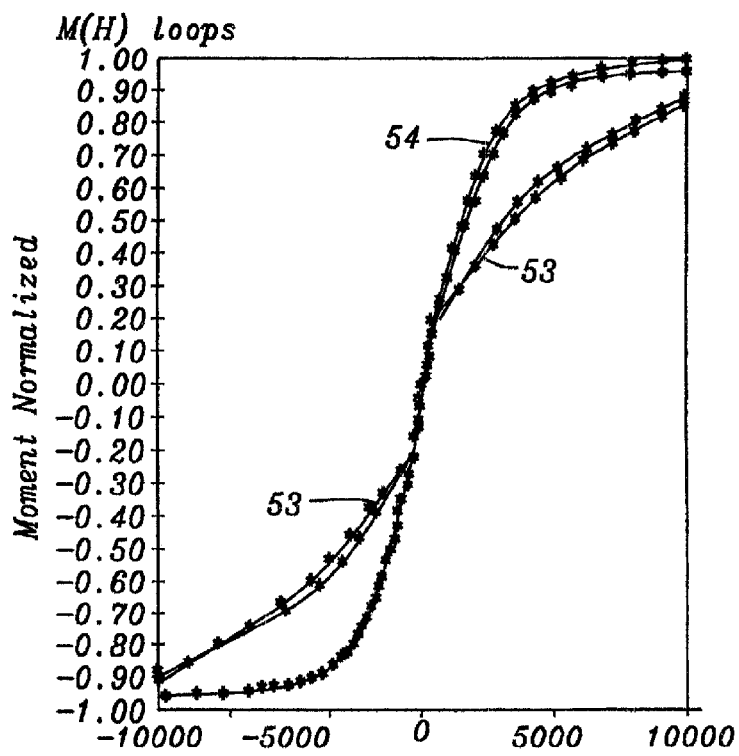

Referring to FIGS. 7a-7b, additional partial spin valve stacks were prepared by sequentially forming a composite seed layer, (Co/Ni)$_{10}$ laminated layer, and Ru capping layer. Coercivity in an in-plane direction with respect to the film plane is illustrated in FIG. 7b for a Hf20/NiCr100 seed layer configuration (curve 53) and for a NiCr100/Hf20 seed layer configuration (curve 54). Magnetization or PMA in a perpendicular-to-plane direction is represented for the Hf/NiCr and NiCr/Hf configurations in curves 51, 52, respectively in FIG. 7a. The resulting laminated films grown on composite seed layers of the present invention show high coercivity and good squareness. Related measurements on single layer seed films show a high saturation field (perpendicular anisotropy) of about 4000 Oe for a Hf underlayer and around 10000 Oe for a NiCr underlayer. Note that in a composite seed layer such as Hf/NiCr, the upper layer which contacts the Co/Ni (or A1-A2) laminate has a larger effect in enhancing PMA in the multilayer than the lower layer contacting the substrate. Since a NiCr underlayer generates a higher PMA than a Hf underlayer (10000 Oe vs. 4000 Oe) as indicated previously, a Hf/NiCr seed layer (curve 51) leads to a higher PMA than a NiCr/Hf seed layer (curve 52)

EXAMPLE 2

To further demonstrate the benefits of the present invention according to a first embodiment where the composite seed layer/laminated PMA layer is formed as a reference layer in a MTJ suitable for spin-torque MRAM devices, a MTJ stack was fabricated as represented in the following stack of layers where the number following each layer is the thickness in Angstroms: Si/SiO$_2$/Ta50/Hf20/NiCr100/(Co2.5/Ni6)$_{10}$/Co$_{20}$Fe$_{60}$B$_{20}$6/MgO/Co$_{20}$Fe$_{60}$B$_{20}$12/Ta20/Ru. In the aforementioned structure, Si/SiO$_2$ is the substrate, Ta is a bottom electrode, Hf/NiCr is a composite seed layer, (Co/Ni)$_{10}$ is the laminated PMA portion of the reference layer, CoFeB is the transitional magnetic layer adjoining a MgO tunnel barrier, CoFeB is the free layer, and Ta/Ru is the capping layer. Thus, (Co/Ni)$_{10}$/Co$_{20}$Fe$_{60}$B$_{20}$ serves as a composite reference layer to provide a high MR ratio wherein the CoFeB portion is thin enough to preserve the PMA property and thick enough to generate a high MR ratio because of cohesive tunneling in the CoFeB/MgO/CoFeB stack of layers. In addition to promoting a high magneto-resistive ratio, the CoFeB free layer is selected for switching purposes. An anneal process comprising a 300° C. temperature treatment for 1 hour was used for this experiment.

Figure 8:
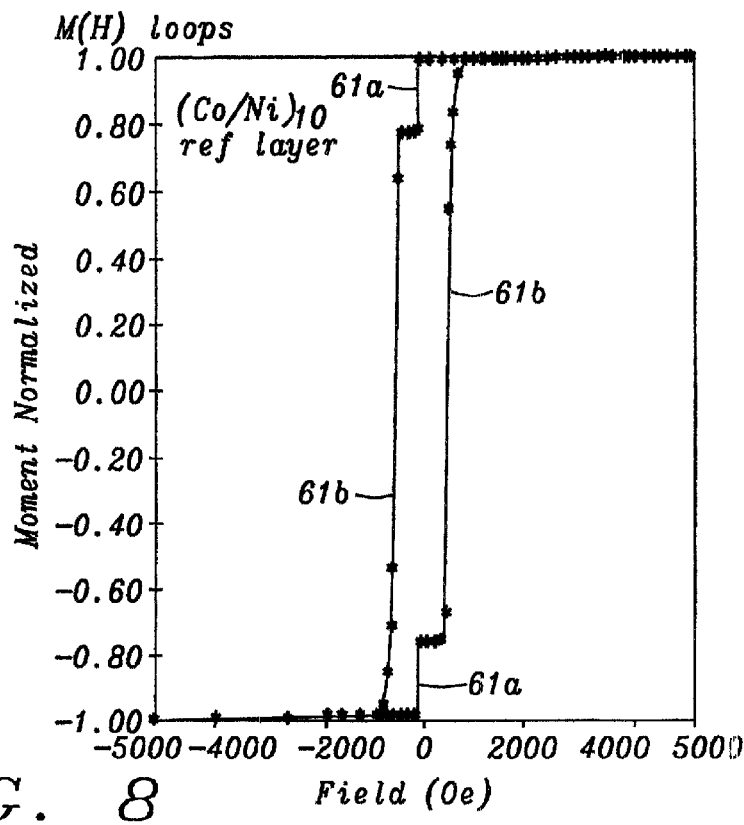
FIG. 8 shows MH curves measured in a direction perpendicular to the film plane for a MTJ element comprised of a $(Co/Ni)_{10}$ laminated reference layer formed on a Hf/NiCr seed layer.

Referring to FIG. 8, a M-H loop measurement is illustrated for the MTJ stack described above and shows significant PMA as a result of the composite reference layer structure, and an additional PMA contribution from the CoFeB free layer. The steps 61a, 61b in the M-H loop indicate the reference layer and free layer switch independently with the reference layer having a much greater coercivity compared with the free layer as revealed by the greater height for step 61b related to the reference layer. Therefore, the reference layer may serve as a "pinned layer".

EXAMPLE 3

According to a third embodiment of the present invention, the composite seed layer/laminated PMA layer as described previously may be incorporated as a dipole layer in a MTJ represented in the following stack of layers: $Si/SiO_2/Ta50/NiCr100/Co_{20}Fe_{60}B_{20}3/MgO/Co_{20}Fe_{60}B_{20}12/Ta10/NiCr20/(Co2.5/Ni6)_{10}/Ru$. In the aforementioned structure, $Si/SiO_2$ is the substrate, Ta50 is a 50 Angstrom thick bottom electrode, NiCr100 is a 100 Angstrom thick seed layer, CoFeB/MgO/CoFeB is a reference layer/tunnel barrier/free layer configuration, and Ta10 is non-magnetic spacer with a 10 Angstrom thickness between the free layer and a 20 Angstrom thick NiCr underlayer for the laminated PMA structure which is $(Co/Ni)_{10}$. Ru is a capping layer.

Figure 9:
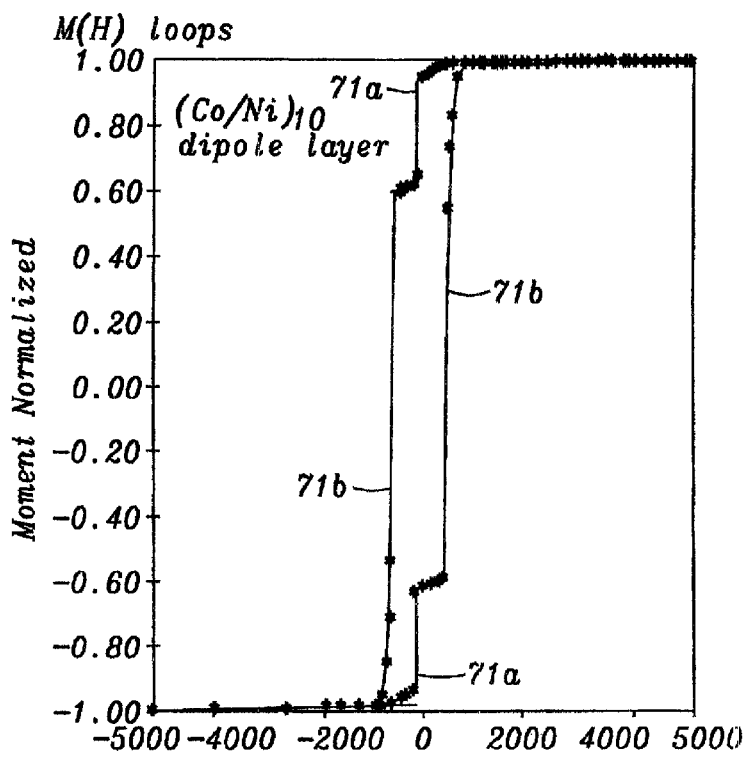
FIG. 9 shows MH curves measured in a direction perpendicular to the film plane for a MTJ element comprised of a $(Co/Ni)_{10}$ laminated dipole layer formed on a NiCr seed layer according to an embodiment of the present invention.

Referring to FIG. 9, a M-H loop measurement is depicted that shows magnetization in a direction perpendicular to the film plane of the layers in the aforementioned MTJ stack having a dipole layer. In this case, the dipole layer and free layer both have PMA and switch at different fields allowing the two layers to be set in the desired configuration. Step 71b for the dipole layer is substantially greater than the step 71a for the free layer. There is no PMA contribution observed for the reference layer which is purposely kept very thin at 3 Angstroms for this experiment. In a functional MTJ, reference layer thickness is generally maintained between 5 and 15 Angstroms and would exhibit substantial PMA. By reducing the thickness of the Ta spacer between the dipole layer and the free layer, the dipole layer is allowed to provide more offset field to the free layer. Moreover, the thickness of the NiCr underlayer adjoining the Co/Ni laminate may be adjusted to amplify or reduce the offset field applied to the free layer.

The MTJ elements described herein feature a seed layer/PMA laminated layer combination which offers enhanced PMA properties together with improved compatibility with high temperature processing, and improved compatibility with the design and fabrication of magnetic devices. As a result, the embodiments of the present invention are suitable for a variety of applications including advanced PMA spin-torque MRAM devices, domain wall motion devices, and in-plane magnetic devices wherein it is beneficial to introduce an out-of-plane magnetic anisotropy component as in in-plane spin torque MRAM devices or in partial PMA spin torque MRAM devices. Improved PMA properties include increased Hc and Hk that enable higher thermal stability up to 400° C. processing.

While this invention has been particularly shown and described with reference to, the preferred embodiment thereof, it will be understood by those skilled in the art that various changes in form and details may be made without departing from the spirit and scope of this invention.

We claim:

1. A domain wall motion device, comprising:
   (a) a first stack comprising a lower seed layer and a laminated layer formed thereon wherein the first stack has a first width and wherein the seed layer is one or more of Hf, NiCr, and NiFeCr, and the laminated layer has intrinsic PMA and a composition represented by $(Co/X)_n$ or $(CoX)_n$ structure wherein X is one of V, Rh, Ir, Os, Ru, Au, Cr, Mo, Cu, Ti, Re, Mg, and Si, CoX is a disordered alloy, and n is the number of laminates in the stack; and
   (b) a second stack with a tunnel barrier/free layer/capping layer configuration and having a second width substantially greater than the first width, the tunnel barrier contacts a top surface of the first stack.

2. The domain wall motion device of claim 1 wherein the seed layer consists of Hf, NiCr, NiFeCr, Hf/NiCr, Hf/NiFeCr, NiCr/Hf, or NiFeCr/Hf.

3. The domain wall motion device of claim 1 further comprised of a magnetic layer made of CoFeB, CoFe, or combinations thereof that is formed between the laminated layer and the tunnel barrier layer, the magnetic layer has PMA with a magnetization in the same direction as the PMA in the laminated layer.

4. The domain wall motion device of claim 1 wherein n is from 2 to 30.

5. The domain wall motion device of claim 1 wherein the free layer is part of a wire in an array of wires that is used to store digital information.

6. The domain wall motion device of claim 1 wherein each of the plurality of Co layers in the $(Co/X)_n$ layer has a thickness from about 1.5 to 4 Angstroms, and each of the plurality of X layers has a thickness from about 4 to 10 Angstroms.

* * * * *